United States Patent [19]
Baldwin

[11] 4,342,965
[45] Aug. 3, 1982

[54] WAVEFORM INSTABILITY DETECTOR

[76] Inventor: Johnny E. Baldwin, 11031 McBride Dr., Huntsville, Ala. 35803

[21] Appl. No.: 189,475

[22] Filed: Sep. 22, 1980

[51] Int. Cl.³ .................... H03K 5/153; G01R 29/027
[52] U.S. Cl. .................................. 328/147; 307/234; 307/360; 307/518; 328/114; 328/135
[58] Field of Search ............... 307/234, 360, 517, 518; 328/110, 112, 114, 132, 135, 147

[56] References Cited
U.S. PATENT DOCUMENTS
3,718,918  2/1973  Fothergill et al. .................... 328/112
3,740,654  6/1973  Rossbach et al. .................... 307/360
3,963,983  6/1976  Hogg .................................... 307/360

*Primary Examiner*—John Zazworsky
*Attorney, Agent, or Firm*—Nathan Edelberg; Robert P. Gibson; Freddie M. Bush

[57] ABSTRACT

A waveform instability circuit provides a voltage/time window for monitoring a known unipolar waveshape or pulse. The voltage/time window is adjustable in dimension and in location along the wavefront. This allows a particularly significant portion of the pulse to be continuously monitored for accuracy or for various segments of the pulse to be selectively monitored merely by repositioning the window. Three voltage comparators are used to determine the reference voltage and voltage window limits. Monostable multivibrators responsive to the reference voltage control the time window limits and logic gates provide the determination of coincidence or anticoincidence of the input waveform section being considered with the window limits.

4 Claims, 7 Drawing Figures

WAVEFORM INSTABILITY DETECTOR

DEDICATORY CLAUSE

The invention described herein may be manufactured, used, and licensed by or for the Government for governmental purposes without the payment to me of any royalty thereon.

SUMMARY OF THE INVENTION

A waveform instability detector is provided which continuously monitors a repetitive unipolar pulse waveform for voltage fluctuation within a voltage/time window occurring at a specified time delay after the waveform meets a reference voltage. The voltage/time window is adjustable and provides a method for verifying whether a waveform meets a required voltage tolerance over a desired time interval or not. In the limit, as the voltage/time window and specified time delay approach 0, the circuit behaves as a piecewise-linear approximation to the waveform over the time delay interval. The detector allows veryifying waveform shape and slope requirements and a series of voltage/time windows spaced along the waveform and synchronized to a reference voltage point can provide a complete piecewise-linear comparison of a waveform.

The waveform instability detector incorporates three comparators and two monostable multivibrators which respond to an input unipolar pulse waveform for providing an adjustable window, which in conjunction with gating circuitry provides an output indicative of excursions of the pulse waveform outside the acceptable range established by the window.

DESCRIPTION OF THE PREFERRED EMBODIMENT

The waveform instability detector is a circuit which allows continuous monitoring of a unipolar pulse waveform for voltage fluctuation. A known, repetitive unipolar pulse may be observed piecemeal, or have selected portions of the pulse observed continuously by having a voltage/time window occur at a predetermined location or locations on the pulse waveform. This allows verification of waveform shape and slope requirements. Basic applications of the instability detector are numerous when the waveform is a fixed repetitive pulse subject only to stability fluctuations. Such basic measurements as amplitude, rise-time, fall-time, pulse width, and repetition rate fluctuation can be readily made. Other uses include measurement or alarm circuits indicating interference, insufficient signal to noise ratio, composite waveform instability, excessive contact bounce, pulsed power variations, insufficient warm-up, oscillations, and impedance loading.

Figure 1:
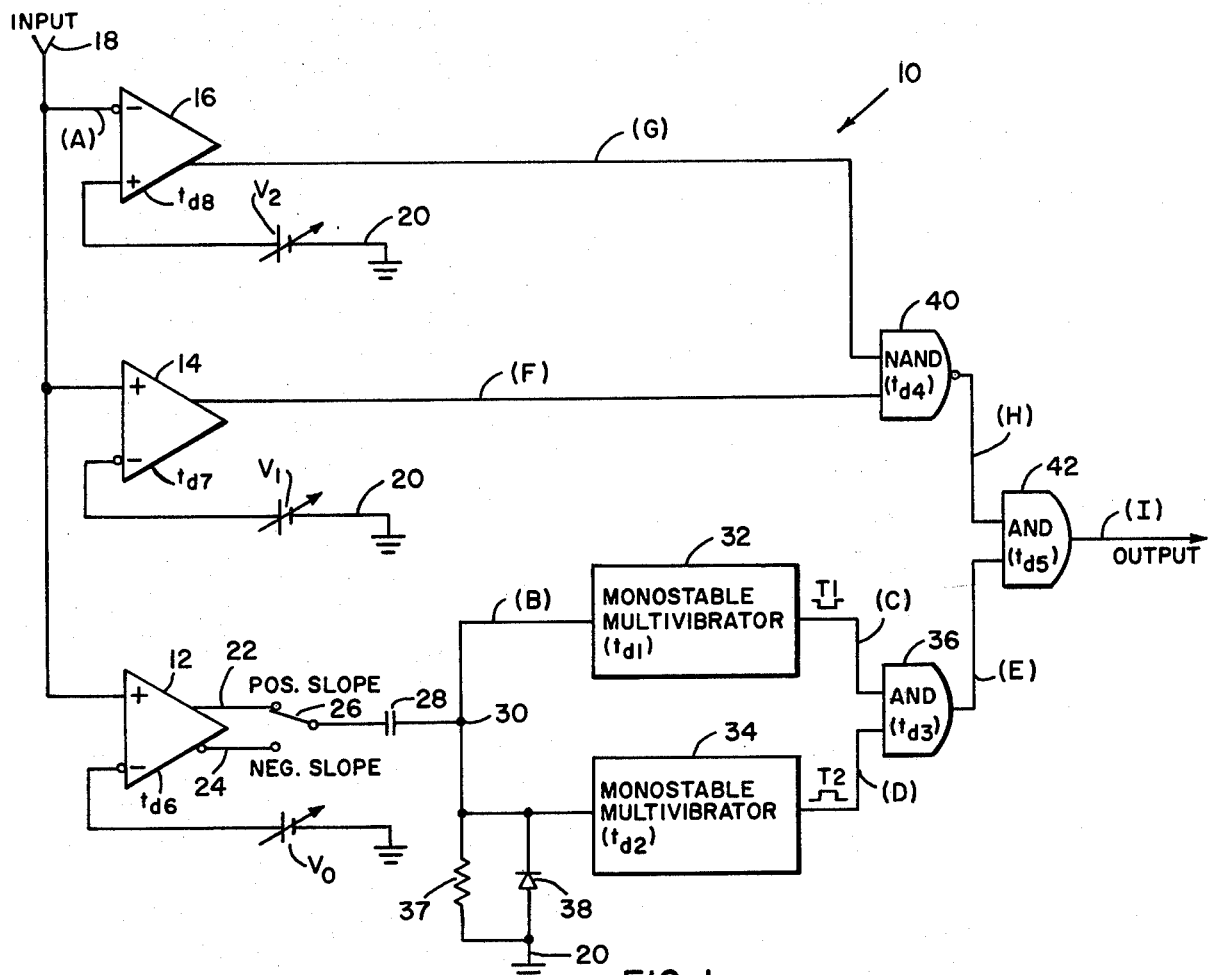
FIG. 1 is a preferred embodiment of a waveform instability detector shown partially in block diagram and partial schematic.

Referring now to the drawings wherein a preferred embodiment is shown in FIG. 1, a waveform instability detector 10 is disclosed comprising voltage comparators 12, 14 and 16 arranged to receive a repetitive unipolar pulse waveform at input 18 for coupling to the positive inputs of comparators 12 and 14 and the negative input of comparator 16. Respective reference voltages $V_0$, $V_1$, and $V_2$ are coupled between a circuit common 20 and comparators 12, 14 and 16 respectively. These voltages are variable for providing an adjustable voltage reference input to the comparators, with $V_0$ being coupled to the negative input of comparator 12, $V_1$ being coupled to the negative input of comparator 14, and $V_2$ being coupled to the positive input of comparator 16. Outputs 22 and 24 of comparator 12 are selectively coupled through a switch 26 to a capacitor 28 for providing a differentiated signal at point 30. Precision monostable multivibrators 32 and 34 are coupled to point 30 for receiving the input signal from comparator 12, operating on this signal, and providing respective outputs to an AND gate 36. In conjunction with capacitor 28, resistor 37 coupled between circuit common 20 and point 30 provides the differentiated signal. A diode 38 coupled across resistor 37 limits reverse voltages coupled to the multivibrators. The output of voltage comparator 14 is a normally LOW output signal as long as the input pulse remains less than $V_1$. This output is coupled as an input to a NAND gate 40. The output of comparator 16 is coupled as another input to NAND gate 40 and is normally a HIGH output until the input signal exceeds $V_2$. Outputs from AND gate 36 and NAND gate 40 are coupled as inputs to an AND gate 42 which provides a HIGH output only when both inputs are HIGH.

In the measurement of waveform fluctuations the circuit requires that every pulse reach the required voltage tolerance within a maximum delay time and that this amplitude be maintained for a minimum duration time. The circuit requires that the pulse maintain a voltage tolerance during a portion of its duration and the circuit can distinguish pulses that are stable or unstable over selected portions of its duration. Such parameters as rise-time, fall-time, overshoot and settling time can be measured for fluctuation. Since waveform fluctuations are not detected with an averaging technique, extremely stable as well as ultra-low duty cycle waveforms can be measured for fluctuations by simply counting the total number of unstable pulses in an output train. Random waveform disturbances such as noise, interference and oscillation can be detected over selected portions of the waveform. In operation, when the voltage amplitude of an input waveform exceeds the reference voltage $V_0$ with switch 26 in the positive slope position, or drops below reference voltage $V_0$ with switch 26 in the negative slope position, comparator 12 produces an output HIGH step voltage. This output step is differentiated by capacitor 28 before triggering of the two monostable multivibrators 32 and 34. There is an inherent pulse delay time involved in processing a signal through all system components. Thus, there is a delay from the input of the comparator to the output of the comparator and also an inherent pulse delay time for the monostable multivibrators which is taken into consideration in calibrating the detector. After the momentary delays of comparator 12 and the multivibrators, the two multivibrators produce output pulses of different widths which may be varied or adjusted, $T_1$ and $T_2$, as shown also in FIG. 2. The two output pulses are coupled to AND gate 36, which after a delay produces an output during the period when both inputs are positive or high. Comparator 14 produces an output high-step after a delay when the amplitude of the input waveform exceeds $V_1$. A negative step is produced after a delay when the amplitude falls beneath $V_1$. Comparator 16 maintains a high output level until the input amplitude exceeds $V_2$ creating an output low step after a delay inherent in the comparator. The output remains low until the input pulse falls below reference voltage $V_2$ creating an output high step.

Figure 2:
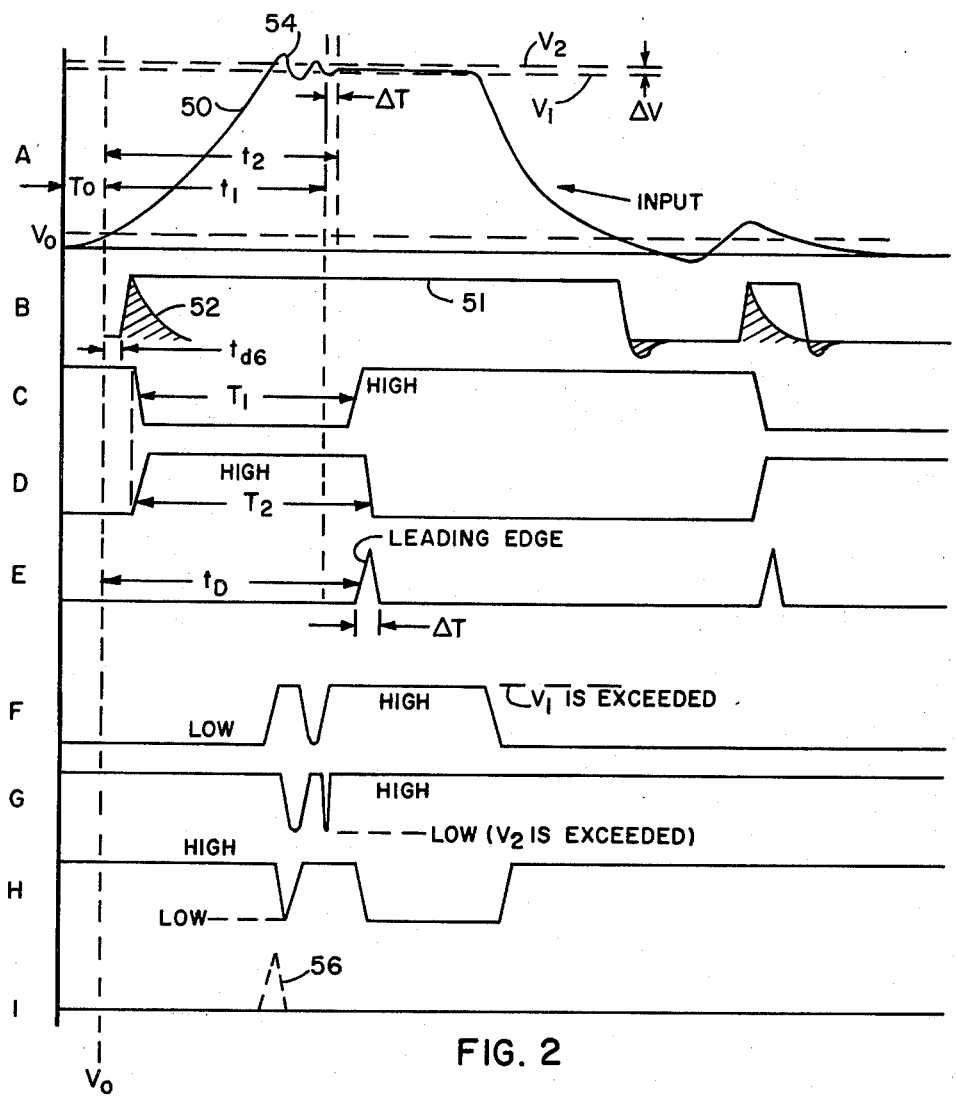
FIG. 2 is a time sequence diagram of the detector response at different points in the detector circuit for a unipolar pulse waveform.

FIG. 2 discloses a time sequence diagram of respective output waveforms of various points in the circuit and the related time delays involved, for a typical input pulse and window position. Reference letters A-F shown in FIG. 2 identify typical wave shapes present at points shown in FIG. 1 with the same letter designation. FIG. 2 A discloses a typical input waveform with some form of ripple 54 at the leading edge of the crest representing settling times instability, mild contact bounce or some other form of jitter prior to stabilization. Reference voltage $V_0$ corresponds to a low reference voltage level on the input pulse at which comparator 12 changes state. $V_1$ and $V_2$ indicate the desired voltage limits within which the input pulse is expected to remain if it is an acceptable pulse. At some time interval $\Delta T$, which is variable or adjustable, after $V_0$ is reached the voltage/time window is established for observing the input pulse during the period that the window is open, or at the pulse passes through this period of time. By varying the voltages $V_1$ and $V_2$ the differential voltage $\Delta V$ may be made small or large depending on the tolerance acceptable. Similarly, by varying the time delay within the system, $\Delta T$ may be made larger or smaller and may be shifted toward the leading edge or trailing edge of the pulse for evaluation of the pulse waveform at any desirable position thereon. For the conditions as shown in FIG. 2A the wave shapes of FIGS. 2B-I occur after an inherent and controlled time delay. FIG. 2B discloses the output wave 51 is comparator 12 with the differentiated pulse 52 which occurs at capacitor 28 superimposed thereon. The comparator 12 output pulse remains in effect as long as the pulse waveform exceeds $V_0$. In response to the differentiated pulse 52 multivibrators 32 and 34 activate providing respective output pulses of FIGS. 2C and 2D. The LOW output pulse $T_1$ of FIG. 2C must be different in length or time from the HIGH output pulse $T_2$ of FIG. 2D to establish the window.

For the embodiment of FIG. 1 it is desired to compare every pulse within a waveform train to a predetermined requirement that the amplitude of the waveform appear within the voltage tolerance $\Delta V$ established by $V_2-V_1$ during the time window $\Delta T$, or $t_2-t_1$. A comparison of each subsequent pulse to this requirement is made when two conditions are established. First, the leading edge delay of the sample pulse at (E) from occurence of the $V_0$ reference point on the input waveform (A) is adjusted to equal the leading-edge delay of the time window $\Delta T$ from the $V_0$ reference point plus the total corresponding propagation delays ($t_D$) of the system components which is necessary to propagate to point (H) any input waveform variation that might occur during the time window $\Delta T$. Second, the width of the pulse at (E) must be equal to the time window $\Delta T$. These conditions establish coincidence or anticoincidence of waveforms (E) and (H). Coincidence is defined as the condition where a positive or HIGH pulse is observed at (H) at some time during the duration of the HIGH pulse at (E). This occurs only if both or at least one of the comparator outputs of comparators 14 or 16 are LOW. A truth table (not shown) of the inputs and outputs of comparators 14 and 16 reveals that the HIGH pulse at (H) corresponds to the input amplitude exceeding $V_2$ or becoming less than $V_1$. Thus, coincidence indicates that a waveform fluctuation outside the required tolerance $\Delta V$ occurred during the time window $\Delta T$. If the window had been positioned to coincide with the peak 54 of FIG. 2A, an output pulse 56 would have occured at FIG. 2I as is shown in dash lines.

Anticoincidence is defined as the condition where no positive or HIGH pulse is observed at (H) during the duration of the pulse at (E), indicating that the waveform maintained the required voltage tolerance during the time window. This occurs only with simultaneous high outputs from comparators 14 and 16 as shown in FIGS. 2F and 2G corresponding to the input amplitude exceeding $V_1$ but not exceeding $V_2$.

While numerous factors affect the accuracy of the stability detection circuit, they are only significant where extreme precision or speed is required, as noted typically hereinbelow. High precision voltage measurement with the voltage window $\Delta V$ is easily obtained with precision voltage supplies $V_1$ and $V_2$ and the characteristic or inherent small offset voltages $V_{os}$ (not shown) of the comparators. Major sources of error are the time delay errors associated with the pulses at (E) and (H), due mainly to the particular propagation delay variations of the various electronic devices and the monostable pulse width variations. The monostable output pulse widths are susceptible to variation due to temperature, output loading, and input/output isolation effects. High stability is essential to prevent leading-edge and width variations in the pulse at (E). In a typical monostable time window circuit, the multivibrators may be Texas Instrument SN54221, a dual monostable multivibrator having a Schmitt-trigger input. In these multivibrators $T_1$ and $T_2$ are internally compensated against fluctuations in voltage and temperature. Jitter-free operation is normally limited only by the stability of the biasing resistors and capacitors.

Figure 5:
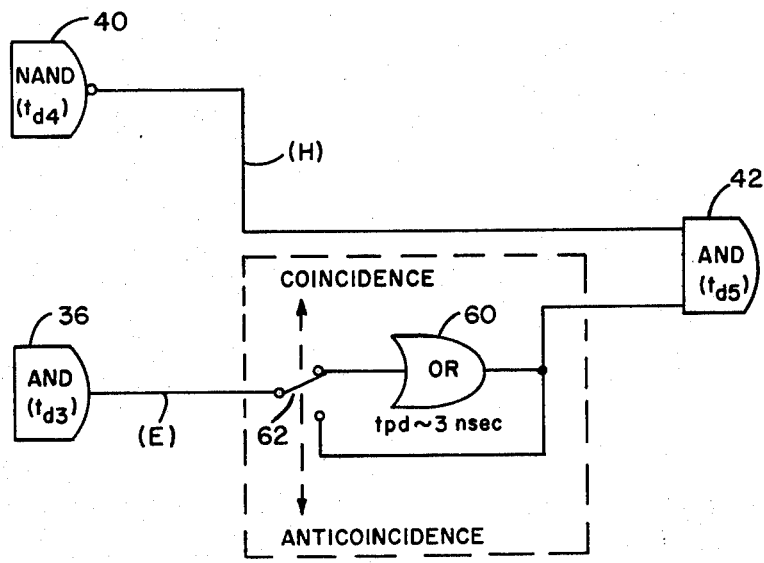
FIG. 5 is a typical coincidence/anticoincidence delay circuit for the embodiment of FIG. 1.

A variation in the leading-edge delay of the pulse at (E) occurs between the conditions for coincidence and anticoincidence of the pulses at (E) and (H). For normal operations with a relative large time window, $t_2-t_1$, this variation is insignificant. Typically, with comparators 12, 14 and 16 being an Advanced Micro Devices comparator AM686 and using Schottky-TTL NAND gate, this difference or variation is approximately only 3 nanoseconds and is significant only when the time window is quite small or when the possibility of an undetected or falsely detected ultra-fast waveform excursion at the edges of the voltage window is unacceptable for operation. If desired, this condition can be avoided by performing precise calibration of the circuit timing or designing a selectable delay circuit at the output of AND gate 36 to compensate for the variation. A typical delay circuit is shown in FIG. 5 wherein an OR gate 60 is coupled between AND gate 36 and AND gate 42. A switch 62 allows the OR gate to be used for coincidence mode and omitted for anticoincidence, inserting or omitting a pulse delay time of approximately 3 nanoseconds. The OR gate is specially selected for 3 nanosecond delay. The coincidence setting of the switch corresponds to most accurate detection for instability during the window, while the anticoincidence setting corresponds to most accurate detection for stability during the window.

Figure 6:
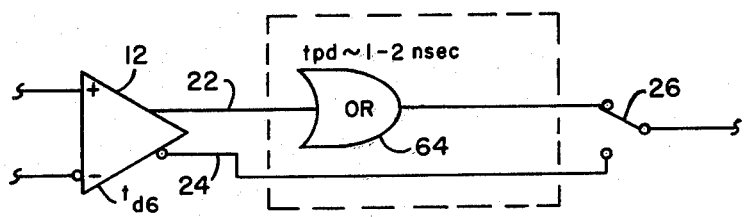
FIG. 6 is a typical complementary delay matching circuit for the embodiment of FIG. 1.

A slight variation in the propagation delays of the complementary outputs 22 and 24 of comparator 12 exists, which results in a slight variation in the total delay of the sample pulse at (E), depending upon the slope switch setting. For the AM686 this is typically 1 or 2 nanoseconds and this variation is significant only for the unusual conditions as noted hereinabove. This condition is readily remedied by calibration of the circuit with the slope switch in the desired position or by inserting a selectable delay circuit to compensate for the variation. A typical delay circuit is shown in FIG. 6 wherein an OR gate 64 is connected between the non-inverted output of comparator 12 and switch 26. The OR gate 64 is specially selected for 1-2 nanoseconds propagation delay and is placed on the appropriate output of comparator 12.

Figure 7:
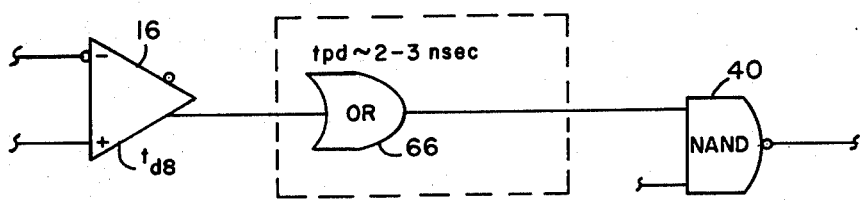
FIG. 7 is a typical window delay matching circuit for the embodiment of FIG. 1.

A slight variation in propagation delay between comparators 14 and 16 may exist, which for the example AM686 comparator is typically 2-3 nanoseconds. A propagation delay variation of this type cannot be calibrated out due to the design criteria of continuous monitoring of waveform excursions both above and below the voltage window, $\Delta V$. Therefore, it is important that matched comparators be used for high speed applications or that selectable delay circuits be included at the outputs of one or both comparators 14 and 16 to substantially match the individual time delays of the comparators. FIG. 7 shows a typical delay circuit wherein an OR gate 66 is connected between the non-inverted output of comparator 16 and AND gate 40. The OR gate is placed on the appropriate comparator (14-16) output which is selected to allow the optimum delay match between the two comparators for the three conditions of input voltage-greater than $V_2$, less than $V_1$, and between $V_2$ and $V_1$.

A propagation delay variation may occur with direct current input bias on comparators 12, 14 and 16. This is significant only for ultrafast waveforms and is eliminated by calibration before use at the desired comparator reference voltages $V_0$, $V_1$, and $V_2$ respectively. Small offset voltages, $V_{os}$ (not shown), of each comparator are compensated for in the adjustments of the reference voltages $V_0$, $V_1$, and $V_2$, as is well established in the art.

A propagation delay variation will also occur with the amount of input overdrive to comparators 12, 14 and 16. This factor is considered in the matching of comparators 14 and 16. In circuit operation, the effect of this variation may be negligible since all comparators experience the overdrive propagation delay variation which approaches a constant value as overdrive increases. Typically, for the AM686 comparator example, this variation is 2 nanoseconds over the input overdrive range of 5-20 milivolts, and the propagation delay is constant for overdrives in excess of 20 millivolts. The overall effect is cancelled out when all comparators experience the same delay, therefore, the overdrive propagation delay variation becomes significant only when overdrives are small. This error, normally not a problem cannot be calibrated out and would be extremely difficult to electrically compensate.

Assuming that none of the errors, noted hereinabove, were calibrated or designed out of the circuit a worst-case cumulative error of only 10 nanoseconds would be realized utilizing the components noted. Any decision to reduce these errors even further are based upon whether or not the detector is to be used on relatively fast waveforms, greatest accuracy is required, or wide circuit adjustment is required. For example, if the input waveform is relatively slow and if fast excursions through the voltage window are acceptable, the circuit is simply adjusted to ignore output pulses less than the desired duration.

The time delays which occur in the system are shown typically in FIG. 2 but are not shown as being precise or to scale. Thus $t_{d6}$ is the time delay of comparator 12 for a positive slope input signal and is shown in FIG. 2B. In FIG. 2C, the time delay from occurence of $V_0$ includes $t_{d1}+t_{d6}$ until the output pulse $T_1$ occurs. Similarly, for start of multivibrator 34 output the time delay is $t_{d2}+t_{d6}$ from $V_0$, as shown in FIG. 2D. In FIG. 2E the time period $t_D$ from occurence of $V_0$, to the leading edge of the pulse is $t_{d6}+t_{d1}+T_1+t_{d3}$. The width of the pulse in FIG. 2E is primarily dependent on the difference between the time paths through the two multivibrators and is substantially the difference between $T_2$ and $T_1$. In the limit, it becomes necessary to consider all propagation delays in FIG. 2E and axactly match them with those in FIG. 2H if precisely accurate window monitoring is required.

Figure 3:
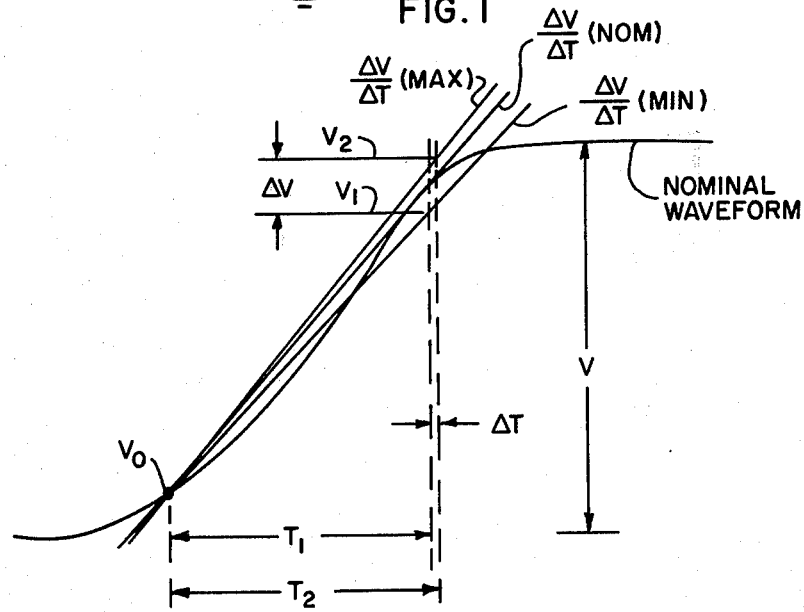
FIG. 3 shows a graphical selection technique for calibrating the detector for rise time detection of a known unipolar pulse.

FIG. 3 discloses a typical graphical selection technique for rise time detection of a nominal waveform. In establishing the window on the leading edge of a waveform the $\Delta V$-$\Delta T$ components of the window may be increased or decreased to enlarge the window at a given area or to relocate the window along the curve of the input waveform. Using $V_0$, the desired reference voltage for comparator 12, as a reference point, 3 lines are drawn along the leading edge of the nominal waveform curve approximating the slope of the curve at the area of interest, providing piecewise-linear approximations. The line which falls above or outside the slope of the waveform ($\Delta V/\Delta T$ maximum) represents the upper acceptable voltage limit during the time interval of interest for concidence. Similarly, the lower line ($\Delta V/\Delta T$ minimum) represents the lower limits within which variation or excursions within the waveform are acceptable. The center line $\Delta V/\Delta T$ nom represents the nominal or desired location of the waveform within the window.

Figure 4:
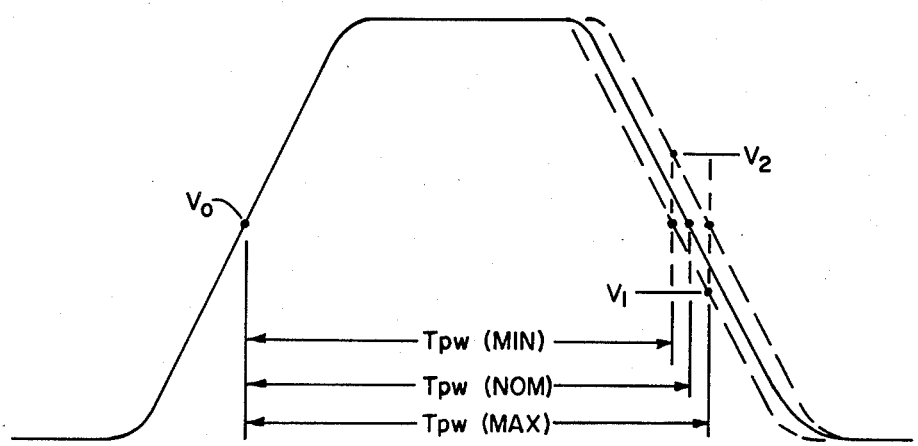
FIG. 4 is a diagram of a pulse waveform for emphasizing graphical selection of detector values for pulse width detection.

FIG. 4 discloses a typical graphical selection technique for pulse width detection for a nominal input waveform. The point of reference is again the reference voltage $V_0$ of comparator 12. The time window can be reduced or enlarged depending on the acceptable variation of the pulse width resulting in voltage limits that are graphically determined from pulse width limits. The desired $V_0$ is selected in both the rise and the fall slopes of the waveform. Lower and upper voltage limits, $V_1$ and $V_2$, are established on either side of $V_0$ on the trailing edge of the curve. The minimum and maximum acceptable times $T_1$ and $T_2$ are determined during which the trailing edge of the waveform must fall within the window, $T_1$ being represented by Tpw (MIN) and $T_2$ being represented by Tpw (MAX). Tpw (NOM) represents the nominal or desired location of the waveform within the window with respect to time.

Although a particular embodiment and form of this invention has been illustrated, it is apparent that various modifications and embodiments of the invention may be made by those skilled in the art without departing from the scope and spirit of the foregoing disclosure. For example, the multivibrators and AND gate 36 may be replaced with programmable delay lines and a flip-flop output to provide an even faster response time than the multivibrators can provide. Changing a particular component such as the multivibrators to improve system speed as components having faster response times become available is an obvious expedient. Accordingly the scope of the invention should be limited only by the claims appended hereto.

I claim:

1. A waveform instability detector for monitoring a repetitive unipolar pulse waveform for voltage fluctuation comprising: first, second and third voltage comparators; gating means for selectively providing output pulses therefrom and adapted to receive inputs from said voltage comparators; and pulse generating means coupled between an output of said first voltage comparator and said gating means; said gating means comprises first and second AND gates and a NAND gate, said NAND gate having first and second inputs coupled to respective outputs of said second and third comparators, said first AND gate having first and second inputs adapted for receiving outputs from said pulse generating means, and said second AND gate having a first input connected to the output of said NAND gate and a second input connected to the output of said first AND gate for providing an output signal in response to input signals thereto.

2. A waveform instability detector as set forth in claim 1 wherein said pulse generating circuit comprises first and second monostable multivibrators having respective inputs coupled in common and adapted for receiving the output of said first comparator, said first monostable multivibrator having an output coupled to said first AND gate and said second monostable multivibrator having an output coupled to said first AND gate for providing an output pulse from said first AND gate when said multivibrator outputs are coincident and of like polarity.

3. A waveform instability detector as set forth in claim 2 and further comprising a differentiator coupled between the output of said first comparator and the inputs of said first and second multivibrators for providing a pulse trigger signal input thereto.

4. A waveform instability detector as set forth in claim 3 and further comprising switching means coupled between said differentiator and the output of said comparator, said first comparator output comprising first and second selectable outputs, and said switch being adapted for selecting which of said outputs is coupled to said differentiator, and further comprising first, second and third variable reference voltages coupled to respective second inputs of said first, second and third comparators respectively, said third reference voltage always being greater in value than said second reference voltage.

* * * * *